United States Patent
Bernhard et al.

(10) Patent No.: US 7,888,301 B2
(45) Date of Patent: Feb. 15, 2011

(54) RESIST, BARC AND GAP FILL MATERIAL STRIPPING CHEMICAL AND METHOD

(75) Inventors: David D. Bernhard, Kooskia, ID (US); Yoichiro Fujita, Saitama (JP); Tomoe Miyazawa, Higashikurume (JP); Makoto Nakajima, Toyama (JP)

(73) Assignee: Advanced Technology Materials, Inc., Danbury, CT (US)

( * ) Notice: Subject to any disclaimer, the term of this patent is extended or adjusted under 35 U.S.C. 154(b) by 532 days.

(21) Appl. No.: 10/581,475

(22) PCT Filed: Dec. 1, 2004

(86) PCT No.: PCT/US2004/040158

§ 371 (c)(1),
(2), (4) Date: Aug. 10, 2007

(87) PCT Pub. No.: WO2005/057281

PCT Pub. Date: Jun. 23, 2005

(65) Prior Publication Data

US 2008/0006305 A1 Jan. 10, 2008

(51) Int. Cl.
*C11D 7/32* (2006.01)

(52) U.S. Cl. ........................ 510/175; 510/176

(58) Field of Classification Search ............... 510/175, 510/176
See application file for complete search history.

(56) References Cited

U.S. PATENT DOCUMENTS

| 5,792,274 | A | 8/1998 | Tanabe et al. | |
|---|---|---|---|---|
| 6,319,835 | B1 | 11/2001 | Sahbari et al. | |
| 6,372,410 | B1* | 4/2002 | Ikemoto et al. | 430/318 |
| 6,773,873 | B2 | 8/2004 | Seijo et al. | |
| 6,831,048 | B2 | 12/2004 | Kezuka et al. | |
| 6,946,396 | B2 | 9/2005 | Miyazawa et al. | |
| 2001/0050350 | A1* | 12/2001 | Wojtczak et al. | 252/175 |
| 2002/0037820 | A1* | 3/2002 | Small et al. | 510/175 |
| 2003/0078173 | A1* | 4/2003 | Wojtczak et al. | 510/175 |
| 2003/0114014 | A1 | 6/2003 | Yokoi et al. | |
| 2003/0181342 | A1* | 9/2003 | Seijo et al. | 510/175 |
| 2004/0029753 | A1* | 2/2004 | Ikemoto et al. | 510/175 |
| 2005/0089489 | A1 | 4/2005 | Carter et al. | |
| 2005/0187118 | A1 | 8/2005 | Haraguchi et al. | |

FOREIGN PATENT DOCUMENTS

| EP | 1277830 | 1/2003 |
|---|---|---|
| WO | 03006599 | 1/2003 |
| WO | 03035797 A1 | 5/2003 |
| WO | 03091376 | 11/2003 |
| WO | 2004094581 | 11/2004 |

* cited by examiner

*Primary Examiner*—Gregory E Webb
(74) *Attorney, Agent, or Firm*—Tristan A. Fuierer; Moore & Van Allen, PLLC

(57) ABSTRACT

An aqueous-based composition and process for removing photoresist, bottom anti-reflective coating (BARC) material, and/or gap fill material from a substrate having such material(s) thereon. The aqueous-based composition includes a fluoride source, at least one organic amine, at least one organic solvent, water, and optionally chelating agent and/or surfactant. The composition achieves high-efficiency removal of such material(s) in the manufacture of integrated circuitry without adverse effect on metal species on the substrate, such as copper, and without damage to SiOC-based dielectric materials employed in the semiconductor architecture.

32 Claims, 2 Drawing Sheets

US 7,888,301 B2

RESIST, BARC AND GAP FILL MATERIAL STRIPPING CHEMICAL AND METHOD

FIELD OF THE INVENTION

The present invention relates to an aqueous-based composition and process for the removal of photoresist, bottom anti-reflective coating material, and gap fill material from a substrate or article having such material thereon using the aqueous-based composition.

DESCRIPTION OF THE RELATED ART

Photolithography techniques comprise the steps of coating, exposure, and development. A wafer is coated with a positive or negative photoresist substance and subsequently covered with a mask that defines patterns to be retained or removed in subsequent processes. Following the proper positioning of the mask, the mask has directed through a beam of monochromatic radiation, such as ultraviolet (UV) light or deep UV (DUV) light ($\lambda \approx 250$ nm), to make the exposed photoresist material more or less soluble in a selected rinsing solution. The soluble photoresist material is then removed, or "developed," leaving behind a pattern identical to the mask.

In order to address transmissivity and reflectivity problems associated with the use of DUV light, which triggers an uneven exposure of the photoresist causing variations in critical dimensions, bottom anti-reflective coatings (BARCs) have been developed which are applied to substrates prior to applying the photoresist. As the photoresist is exposed to DUV radiation, the BARC absorbs a substantial amount of the DUV radiation thereby preventing radiation reflection and transmissivity, and hence uneven exposure.

Oftentimes, a gap fill material is applied to the substrate prior to application of the BARC layer to fill via holes and to planarize the topography. Common gap fill materials include, but are not limited to, fluorinated silicon dioxide, carbon doped silicon dioxide, methylsilsesquioxane (MSQ), hydrogen silsesquioxane (HSQ) and organic fill gap material. In application, the gap fill material is deposited on the substrate and then the BARC material and photoresist deposited thereon.

During back-end-of-line (BEOL) single- and dual-damascene processing, defects may occur during the deposition of gap fill material, BARC, photoresist or other lithographic substance. Defects may also occur during lithographic imaging and development. These defects reduce device yield and make further processing of the device undesirable. Thus, removal of the defective lithographic layers is an important step to rework wafers for further processing following defective manufacturing steps. Importantly, when a cleaner/etchant composition is used in BEOL applications to process surfaces having aluminum or copper interconnected wires, it is important that the composition used to remove photoresist, BARC and/or gap fill material possess good metal compatibility, e.g., a low etch rate on copper, aluminum, cobalt, etc.

Wet chemical formulations well known in the art have disadvantages as well, including the relative insolubility of the gap fill material and the BARC in the liquid cleaner, the risk of damage to the dielectric material caused by the liquid cleaner, unwanted severe damage to the metal interconnect, e.g., Cu, and resist poisoning when resist layers are applied to the surface of the wafer during later processes. Moreover, the wet chemical formulations known in the art are ineffective at temperatures approximating room temperature.

Liquid cleaners known in the art include solutions comprising a 2-pyrolidinone compound, a diethylene glycol monoalkyl ether, a polyglycol and a quaternary ammonium hydroxide (see U.S. Pat. No. 4,744,834). However, this solution is devoid of water and as such, has a high content of hazardous substances which must be properly disposed of in an environmentally safe manner.

Hydroxylamine solutions have also been utilized in the art for photoresist removal, but such solutions have associated corrosion, toxicity and reactivity problems that limit their use, with adverse corrosion effects being particularly problematic when copper is employed in the integrated circuitry.

Gap fill material has etching characteristics similar to those of silicate dielectrics. Unfortunately, because of this etching similarity, the selective removal of gap fill material in lieu of dielectric material, metal interconnects, and etch stop layers has represented a real challenge when formulating a wet chemical formulation.

The art therefore has a continuing need for improved aqueous-based removal compositions that will strip photoresist, BARC material, and gap fill material under mild conditions, such as low temperatures and neutral pHs, while not damaging the metal interconnects or underlying dielectric materials.

SUMMARY OF THE INVENTION

The present invention generally relates to an aqueous-based removal composition and process for the removal of photoresist, BARC material, and gap fill material from a substrate having such material(s) thereon using the aqueous-based removal composition. The aqueous-based removal composition includes a fluoride source, at least one organic amine source, at least one organic solvent, water and optionally, chelating agents and/or surfactants.

In one aspect, the present invention relates to an aqueous-based removal composition useful for removing photoresist, bottom anti-reflective coating (BARC) materials, and/or gap fill materials from a substrate having such material(s) thereon, said composition comprising a fluoride source, at least one organic amine, at least one organic solvent, water, optionally at least one chelating agent, and optionally at least one surfactant.

In another aspect, the present invention relates to a method of removing photoresist, BARC material, and/or gap fill material from a substrate having said material(s) thereon, said method comprising contacting the substrate with an aqueous-based removal composition for sufficient time to at least partially remove said material from the substrate, wherein the aqueous-based removal composition includes a fluoride source, at least one organic amine, at least one organic solvent, water, optionally at least one chelating agent, and optionally at least one surfactant.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1:
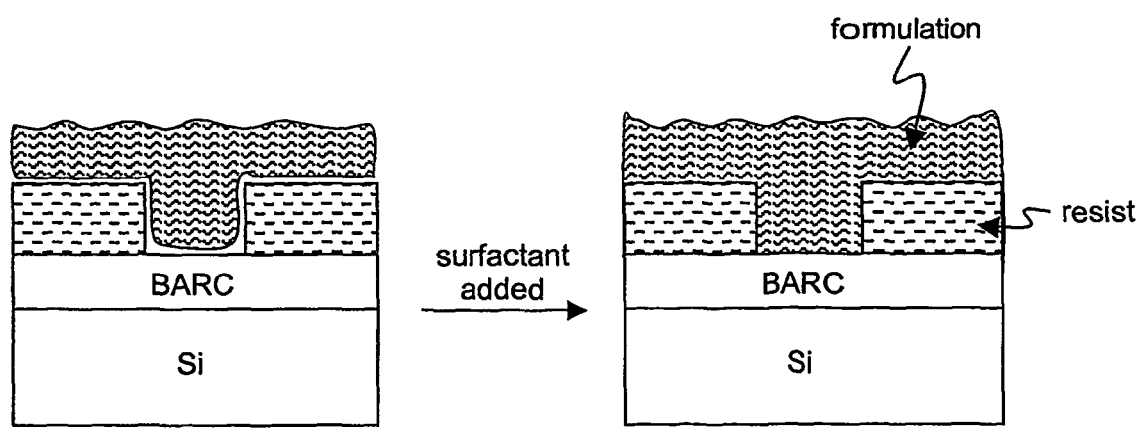
FIG. 1 is a generalized illustration of trench and via penetration enhancement in the presence of a surfactant.

The present invention contemplates aqueous-based removal compositions that are useful to remove photoresist, bottom anti-reflective coating (BARC) materials, and gap fill materials from a substrate having such material(s) thereon. Further, the present invention contemplates methods of using the aqueous-based removal compositions to remove such material(s) from a substrate.

"Photoresist," as used herein, refers to untreated (i.e., developed only) or treated (i.e., developed and subsequently hardened by a process including ion implantation and gas-phase plasma etching) resist material.

"BARC" materials, as used herein, refers to organic and inorganic BARC materials. Organic BARCs include, but are not limited to, polysulfones, polyureas, polyurea sulfones, polyacrylates and poly(vinyl pyridine). Inorganic BARCs include, but are not limited to, silicon oxynitrides ($SiO_xN_y$).

For ease of reference, "material to be removed" as defined herein includes photoresist, BARC, and/or gap fill material.

The aqueous-based removal composition of the present invention includes (a) a fluoride source, (b) at least one organic amine, (c) at least one organic solvent, (d) water and (e) optionally chelating agent and/or surfactant.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

The present invention in one aspect thereof relates to an aqueous-based composition useful for removal of BARC material, photoresist, and/or gap fill material, while simultaneously being compatible with interconnect metals, e.g., copper, and dielectric materials. The aqueous-based composition effectively removes essentially all of the material to be removed from the semiconductor device without causing damage to the dielectric material and without causing corrosion of the underlying metal. The composition comprises a fluoride source, at least one organic amine, at least one organic solvent, water and optionally, chelating agent and/or surfactant, present in the following ranges, based on the total weight of the composition.

| component | % by weight |
| --- | --- |
| fluoride source | about 0.1% to about 15.0% |
| at least one organic amine | about 20.0% to about 60.0% |
| at least one organic solvent | about 1.0% to about 60.0% |
| water | about 20.0% to about 70.0% |

| component | % by weight |
| --- | --- |
| chelating agent | 0.000% to about 20.0% |
| surfactant | 0.000% to about 5.0% | wherein the pH of the composition is in a range from about 5 to about 9.

In the broad practice of the invention, the aqueous-based removal composition may comprise, consist or, or consist essentially of a fluoride source, at least one organic amine, at least one organic solvent, water and optionally, chelating agent and/or surfactant.

In a particularly preferred embodiment, the composition comprises a fluoride source, at least one organic amine, at least one organic solvent, water and surfactant, present in the following ranges, based on the total weight of the composition.

| component | % by weight |
| --- | --- |
| fluoride source | about 5.0% to about 10.0% |
| at least one organic amine | about 35.0% to about 40.0% |
| at least one organic solvent | about 10.0% to about 30.0% |
| water | about 25.0% to about 45.0% |
| surfactant | about 0.05% to about 0.10% | wherein the pH of the composition is in a range from about 5 to about 9. In the broad practice of the invention, the preferred aqueous-based removal composition may comprise, consist or, or consist essentially of a fluoride source, at least one organic amine, at least one organic solvent, water, and surfactant.

Such compositions may optionally include additional components, including stabilizers, dispersants, anti-oxidants, penetration agents, adjuvants, additives, fillers, excipients, etc., that are preferably inactive in the composition.

Fluoride sources are included to destroy the BARC material. The preferred fluoride sources include ammonium fluoride ($NH_4F$), ammonium bifluoride (($NH_4$)$HF_2$), hydrogen fluoride (HF), tetraalkylammonium difluorides (($R$)$_4N_2$, where R is methyl, ethyl, butyl, phenyl or fluorinated $C_1$-$C_4$ alkyl groups), alkyl phosphonium difluorides (($R$)$_4PHF_2$, where R is methyl, ethyl, butyl, phenyl or fluorinated $C_1$-$C_4$ alkyl groups) and triethylamine trihydrofluoride (($C_2H_5$)$_3N·3HF$). In a particularly preferred embodiment, the fluoride source is ammonium fluoride or ammonium bifluoride.

The inclusion of organic amine(s) with the fluoride source serve to increase the solubility of the composition for material to be removed, relative to an aqueous solution of fluoride source alone, and/or serve as an interlayer dielectric (ILD) corrosion inhibitor. Preferred organic amines include, but are not limited to, hydroxyethylpiperazine (HEP), hydroxypropylpiperazine (HPP), aminoethylpiperazine (AEP), aminopropylpiperazine (APP), hydroxyethylmorpholine (HEM), hydroxypropylmorpholine (HPM), aminoethylmorpholine (AEM), aminopropylmorpholine (APM), triethanolamine (TEA), pentamethyldiethylenetriamine (PMDETA), dimethylaminoethoxyethanol (DMAEE), aminoethoxyethanol (AEE), ethylene urea (EU), trimethylaminoethylethanolamine (TMAEEA), trimethylaminopropylethanolamine (TMAPEA), N-(2-cyanoethyl) ethylenediamine (CEEDA), and N-(2-cyanopropyl) ethylenediamine (CPEDA). Particularly preferred organic amines include ethylene urea, hydroxyethylmorpholine, and N-(2-cyanoethyl) ethylenediamine.

The inclusion of organic solvent(s) with the fluoride source serve to increase the solubility of the composition for material to be removed, relative to an aqueous solution of fluoride source alone. Preferred organic solvents include, but are not limited to, 1,4-butanediol (1,4-BD), 1,3-butanediol (1,3-BD), ethylene glycol (EG), propylene glycol (PG), N-methyl-2-pyrrolidone (NMP), DMSO, r-butyrolactone (GBL), propylene glycol monomethyl ether (PGME), propylene glycol monomethyl ether acetate (PGMEA), diethyleneglycol monobenzylether (BzDG), ethyl lactate (EL), ammonium lactate (AL), and dimethyl acetamide (DMAc). Particularly preferred organic solvents include propylene glycol monomethyl ether, 1,4-butanediol, r-butyrolactone, N-methyl-2-pyrrolidone, and ammonium lactate.

The chelating agent, when present, serves to passivate metals by selectively binding to metal surfaces, especially metallic copper. The chelating agent in such composition can be of any suitable type, and may include, without limitation, iminodiacetic acid (IDA), boric acid (BA), ammonium borate, ammonium tetraborate, gluconic acid, mannitol, and sorbitol. Particularly preferred chelating agents include boric acid and iminodiacetic acid.

The surfactant, when present, may serve to increase removal of photoresist, BARC material, and/or gap fill material by lifting off the residue into the solution, and lowering the surface tension to ensure the wet chemical formulation penetrates the trenches and vias as shown in FIG. 1. Preferred surfactants include, but are not limited to, $(C_1-C_{15})$ alkyl glucosides, $(C_1-C_{15})$ alkyl ethylene oxide/propylene oxide, $(C_1-C_{10})$ alkyl phenoxy ethylene oxide/propylene oxide, and oxirane, methyl-, polymer with oxirane, ether with 2,2'-(oxidoimino)bis(ethanol) (2:1) or N(-3-(C(-11-isoalkyloxy)propyl) derivatives. Particularly preferred surfactants include, but are not limited to: decyl glucoside; alkyl EOPO amine oxides such as AO-405 and AO-455; EO octylphenols such as CA-520, CO-630, CA-720 and CO-890; and EO nonylphenols such as CO-210, CO-520, CO-990 and DM-970. Most preferably, the surfactant used has a low foaming ability.

The aqueous-based compositions of the invention are easily formulated by simple addition of the respective ingredients and mixing to homogeneous condition.

In application, the aqueous-based composition is applied in any suitable manner to the material to be removed, e.g., by spraying the aqueous-based composition on the surface of the material to be removed, by dipping (in a volume of the aqueous-based composition) of the wafer including the material to be removed, by contacting the wafer including the material to be removed with another material, e.g., a pad, or fibrous sorbent applicator element, that is saturated with the aqueous-based composition, or by any other suitable means, manner or technique by which the aqueous-based composition is brought into removal contact with material to be removed.

As applied to semiconductor manufacturing operations, the aqueous-based compositions of the present invention are usefully employed to remove photoresist, BARC material, and/or gap fill material from substrates and semiconductor device structures on which such material(s) have been deposited. Additionally, the aqueous-based compositions may be useful for wafer recycling processes owing to failure during lithographic processes, and forming vias/trenches with or without the need to use an ashing process.

The compositions of the present invention, by virtue of their selectivity for such photoresist, BARC material, and/or gap fill material relative to other materials that may be present on the semiconductor substrate, e.g., ILD structures, metal interconnects, barrier layers, etc., achieve removal of the such material(s) in a highly efficient manner.

In use of the compositions of the invention for removing photoresist, BARC material, and/or gap fill material from semiconductor substrates having same thereon, the aqueous-based composition typically is contacted with the substrate for a time of from about 1 minute to about 20 minutes, preferably about 1 minute to about 5 minutes, at temperature in a range of from about 21° C. to about 40° C. Such contacting times and temperatures are illustrative, and any other suitable time and temperature conditions may be employed that are efficacious to at least partially remove the photoresist, BARC material, and/or gap fill material from the substrate, within the broad practice of the invention. Preferably, at least 90% of the photoresist, BARC material, and/or gap fill material is removed from the substrate using the aqueous-based composition of the present invention, as determined by optical microscopy. More preferably, more than 99.9% of the material(s) are removed.

Following the achievement of the desired removal action, the aqueous-based composition is readily removed from the substrate or article to which it has previously been applied, e.g., by rinse, wash, or other removal step(s), as may be desired and efficacious in a given end use application of the compositions of the present invention.

The features and advantages of the invention are more fully illustrated by the following non-limiting examples, wherein all parts and percentages are by weight, unless otherwise expressly stated.

EXAMPLE 1

KrF resist (UV113, Shipley Co., Marlborough, Mass.) and BARC (DUV42P, Nissan Chemical Industries, Ltd., Tokyo, Japan) were coated on bare tetra-ethyl-ortho-silicate (TFOS) wafers. The resist/BARC coated wafers were lithographically developed to make a resist-patterned wafer using methods well known in the art. Each wafer was immersed in formulations A-K (see Tables 1 and 2 below) at the temperature indicated for the length of time indicated. Following immersion, the wafers were removed from the formulation, rinsed with deionized water and dried. The amount of TEOS etched and the resist/BARC stripping ability of the respective formulation was determined using optical microscopy.

TABLE 1

| component | A | B | C | D |
|---|---|---|---|---|
| deionized water | 25 wt % | 25 wt % | 31.5 wt % | 5 wt % |
| HF | — | — | — | 30 wt % |
| NH$_4$F | 1 wt % | 1 wt % | — | — |
| NH$_4$F/HF | — | — | 6.5 wt % | — |
| EU | — | — | 21 wt % | — |
| HEM | — | — | 21 wt % | 30 wt % |
| CEEDA | — | — | — | 7 wt % |
| 1,4-butanediol | — | — | 20 wt % | — |
| GBL | 24.5 wt % | 24.5 wt % | — | — |
| NMP | — | — | — | 28 wt % |
| DMAc | 29 wt % | 29 wt % | — | — |
| ammonium lactate | 20 wt % | 18.5 wt % | — | — |
| boric acid | — | 2 wt % | — | — |
| IDA | 0.5 wt % | — | — | — |
| total TEOS etch | 5 nm | 5 nm | 90 nm | — |
| Resist/BARC stripping | 100% | 100% | 100% | <50% |
| treatment temperature | 40° C. | 40° C. | 40° C. | 40° C. |
| treatment time | 15 min | 15 min | 10 min | 5 min |

TABLE 2

|  | E | F | G | H | I | J | K |
|---|---|---|---|---|---|---|---|
| deionized water | 42 wt % | 42 wt % | 42 wt % | 40 wt % | 40 wt % | 30 wt % | 30 wt % |
| NH₄F/HF | 8 wt % | 8 wt % | 8 wt % | 10 wt % | 8 wt % | 8 wt % | 8 wt % |
| HEM | 30 wt % | 30 wt % | 30 wt % | 30 wt % | 30 wt % | 30 wt % | 30 wt % |
| CEEDA | 7 wt % | 7 wt % | 7 wt % | 7 wt % | 7 wt % | 7 wt % | 7 wt % |
| PGME | 10 wt % | — | 13 wt % | 13 wt % | 15 wt % | 25 wt % | 24 wt % |
| EL | — | 10 wt % | — | — | — | — | — |
| IDA | 3 wt % | 3 wt % | — | — | — | — | — |
| ammonium tetraborate | — | — | — | — | — | — | 1 wt % |
| decyl glucoside | — | — | 0.05 wt % | — | 0.05 wt % | — | — |
| total TEOS etch | 50 nm | 40 nm | 20 nm | 14 nm | 5 nm | 4.5 nm | 8.7 nm |
| total th-SiO₂ etch | — | — | — | — | 1.1 nm | 0.71 nm | — |
| resist/BARC stripping | 100% | 100% | 100% | 100% | 100% | 100% | 100% |
| treatment temp. | 40° C. | 40° C. | 30° C. | 25° C. | 40° C. | 25° C. | 40° C. |
| treatment time | 20 min | 20 min | 20 min | 20 min | 3 min | 5 min | 5 min |

Formulations A and B disclosed in Table 1 were effective resist/BARC strippers, while minimally etching the underlying TEOS. Unfortunately, the time of treatment (approximately 15 min) was substantial, which indicates that formulations A and B did not have enough resist/BARC stripping ability. Formulations E-H disclosed in Table 2, which disadvantageously had a high TEOS etch rate, also did not have enough resist/BARC stripping ability (treatment time was approximately 20 min). In addition, it was observed that the formulations that included IDA left a chemical residue on the wafer.

Figure 2A:
FIG. 2A is an optical microscopic photograph of a TEOS wafer coated with KrF resist and a BARC layer following immersion in Formulation I of the present invention for 2 minutes.
Figure 2B:
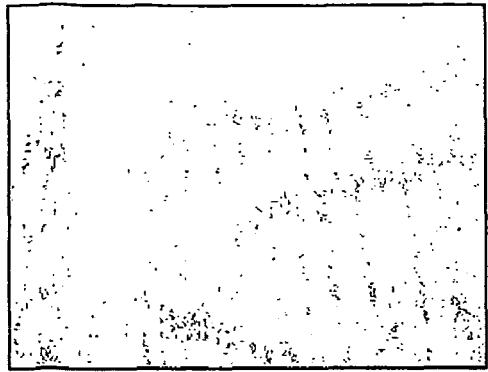
FIG. 2B is an optical microscopic photograph of the same TEOS wafer of FIG. 2A following immersion in Formulation I of the present invention for a cumulative total of 3 minutes.
Figure 3A:
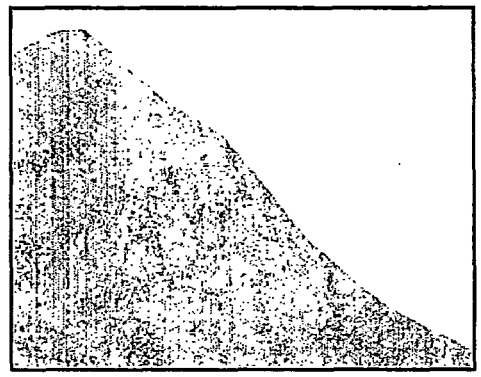
FIG. 3A is an optical microscopic photograph of a TEOS wafer coated with KrF resist and a BARC layer following immersion in Formulation J of the present invention for 3 minutes.
Figure 3B:
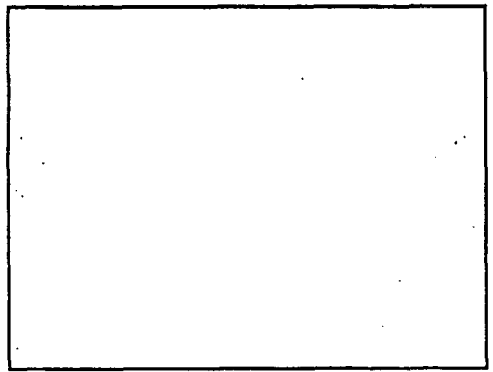
FIG. 3B is an optical microscopic photograph of a TEOS wafer of FIG. 3A following immersion in Formulation J of the present invention for a cumulative total of 5 minutes.

Based on the experiments performed using Formulations A-H, the formulation recipe was altered to be IDA free with the intent of having a treatment time less than 5 min, a treatment temperature approximating room temperature and minimal etching of the underlying TEOS layer, e.g., less than 5 nm. Towards that end, formulations I-K in Table 2 were prepared and the successful results reported. FIGS. 2 and 3 represents the optical microscopic observation of the wafer stripped by formulations I and J, respectively. With reference to formulation I, after 2 min and 3 min approximately 50% and 100% of the resist/BARC was stripped (see FIG. 2A and FIG. 2B, respectively). With reference to formulation J, after 3 min and 5 min approximately 50% and 100% of the resist/BARC was stripped (see FIG. 3A and FIG. 3B, respectively).

EXAMPLE 2

Further experiments were performed where the surfactant in formulation I (0.05 wt % decyl glucoside) was replaced with other well known surfactants and the resist/BARC stripping ability determined. When about 0.10 wt % of alkyl EOPO amine oxide (AO-405 or AO-455) was included in formulation I, 100% of the resist/BARC material was removed in just 3 min at 40° C. When about 0.10 wt % of EO-octylphenol (CA-520, CA-630, CA-720 and CO-890) was included in formulation I, only CA-630 removed 100% of the resist/BARC material in 3 min at 40° C. When about 0.10 wt % of EO-nonylphenol (CO-210, CO-520, CO-990 and DM-970) was included in formulation I, only CO-990 did not remove 100% of the resist/BARC material in 3 min at 40° C.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An aqueous-based removal composition comprising a fluoride source, at least one organic amine, at least one organic solvent, water, optionally at least one chelating agent, and optionally at least one surfactant, wherein the at least one organic amine comprises a species selected from the group consisting of N-(2-cyanoethyl) ethylenediamine, hydroxypropylpiperazine, aminopropylpiperazine, hydroxypropylmorpholine, aminoethylmorpholine, ethylene urea, trimethylaminoethylethanolamine, trimethylaminopropylethanolamine, and N-(2-cyanopropyl) ethylenediamine, and wherein said composition is useful for removing photoresist, bottom anti-reflective coating (BARC) materials, and/or gap fill materials from a substrate having such material(s) thereon.

2. The composition of claim 1, wherein the at least one organic amine comprises N-(2-cyanoethyl)ethylenediamine.

3. The composition of claim 1, wherein the fluoride source comprises a fluoride-containing compound selected from the group consisting of ammonium fluoride, hydrogen fluoride, ammonium bifluoride, tetraalkylammonium difluoride, alkyl phosphonium difluoride, and triethylamine trihydrofluoride.

4. The composition of claim 1, wherein the fluoride source comprises ammonium fluoride.

5. The composition of claim 1, further comprising at least one additional organic amine.

6. The composition of claim 5, wherein the at least one additional organic amine comprises an amine-containing compound selected from the group consisting of hydroxyethylpiperazine, hydroxypropylpiperazine, amino ethylpip erazine, aminopropylpiperazine, hydroxyethylmorpholine, hydroxypropylmorpholine, aminoethylmorpholine, aminopropylmorpholine, triethanolamine, pentamethyldiethylenetriamine, dimethylaminoethoxyethanol, aminoethoxyethanol, ethylene urea, trimethylaminoethylethanolamine, trimethylaminopropylethanolamine, and N-(2-cyanopropyl) ethylenediamine.

7. The composition of claim 1, wherein the at least one organic solvent comprises a compound selected from the group consisting of 1,4-butanediol, 1,3-butanediol, ethylene glycol, propylene glycol, N-methyl-2-pyrrolidone, DMSO, r-butyrolactone, propylene glycol monomethyl ether, propylene glycol monomethyl ether acetate, diethyleneglycol monobenzylether, ethyl lactate, ammonium lactate, and dimethyl acetamide.

8. The composition of claim 1, wherein the at least one organic solvent comprises propylene glycol monomethyl ether.

9. The composition of claim 1, comprising chelating agent.

10. The composition of claim 9, wherein the chelating agent comprises a compound selected from the group consisting of iminodiacetic acid, boric acid, ammonium borate, ammonium tetraborate, gluconic acid, mannitol, and sorbitol.

11. The composition of claim 1, comprising surfactant.

12. The composition of claim 11, wherein the surfactant comprises a compound selected from the group consisting of: ($C_1$-$C_{15}$) alkyl glucosides; ($C_1$-$C_{15}$) alkyl ethylene oxide/propylene oxide;
($C_1$-$C_{10}$) alkyl phenoxy ethylene oxide/propylene oxide; and oxirane, methyl-, polymer with oxirane, ether with 2, 2'-(oxidoimino)bis(ethanol) (2:1) and N(-3-(C(-11-isoalkyloxy)propyl) derivatives.

13. The composition of claim 11, wherein the surfactant comprises a compound selected from the group consisting of decyl glucoside, alkyl EOPO amine oxide, EO octylphenol, and EO nonylphenol.

14. The composition of claim 1, selected from the group consisting of Formulations A-F, wherein all percentages are by weight, based on total weight of the formulation:
Formulation A
about 8% $NH_4F$/HF;
about 30% hydroxyethylmorpholine;
about 7% N-(2-cyanoethyl) ethylenediamine;
about 15% propylene glycol monomethyl ether;
about 40% de-ionized water; and
about 0.05% decyl glucoside;
Formulation B
about 8% $NH_4F$/HF;
about 30% hydroxyethylmorpholine;
about 7% N-(2-cyanoethyl) ethylenediamine;
about 25% propylene glycol monomethyl ether; and
about 30% de-ionized water;
Formulation C
about 8% $NH_4F$/HF;
about 30% hydroxyethylmorpholine;
about 7% N-(2-cyanoethyl) ethylenediamine;
about 24% propylene glycol monomethyl ether;
about 30% de-ionized water; and
about 1% ammonium tetraborate;
Formulation D
about 8% $NH_4F$/HF;
about 30% hydroxyethylmorpholine;
about 7% N-(2-cyanoethyl) ethylenediamine;
about 15% propylene glycol monomethyl ether;
about 40% de-ionized water; and
about 0.10% alkyl EOPO amine oxide surfactant;
Formulation E
about 8% $NH_4F$/HF;
about 30% hydroxyethylmorpholine;
about 7% N-(2-cyanoethyl) ethylenediamine;
about 15% propylene glycol monomethyl ether;
about 40% de-ionized water; and
about 0.10% EO octylphenol surfactant; and
Formulation F
about 8% $NH_4F$/HF;
about 30% hydroxyethylmorpholine;
about 7% N-(2-cyanoethyl) ethylenediamine;
about 15% propylene glycol monomethyl ether;
about 40% de-ionized water; and
about 0.10% EO nonylphenol surfactant;
wherein the total of the weight percentages of such components of the composition does not exceed 100% by weight.

15. The composition of claim 1, comprising the following components, based on total weight of the composition:
0.1% wt.-15.0% wt. fluoride source;
20.0% wt.-60.0% wt. total organic amine;
1.0% wt.-60.0% wt. total organic solvent;
20.0% wt.-70.0% wt. water;
0.000% wt.-20.0% wt. chelating agent; and
0.000% wt.-5.0% wt. surfactant,
wherein the total of the weight percentages of such components of the composition does not exceed 100% by weight.

16. The composition of claim 1, wherein the pH of the composition is in a range from about 5 to about 9.

17. A method of removing photoresist, BARC material, and/or gap fill material from a substrate having said material (s) thereon, said method comprising contacting the substrate with an aqueous-based removal composition for sufficient time to at least partially remove said material from the substrate, wherein the aqueous-based removal composition includes a fluoride source, at least one organic amine, at least one organic solvent, water, optionally at least one chelating agent, and optionally at least one surfactant, wherein the at least one organic amine comprises a species selected from the group consisting of N-(2-cyanoethyl) ethylenediamine, hydroxypropylpiperazine, aminopropylpiperazine, hydroxypropylmorpholine, aminoethylmorpholine, ethylene urea, trimethylaminoethylethanolamine, trimethylaminopropylethanolamine, and N-(2-cyanopropyl) ethylenediamine 18. The method of claim 17, wherein the substrate comprises a semiconductor device structure.

19. The method of claim 17, wherein said contacting is carried out for a time of from about 1 minute to about 5 minutes.

20. The method of claim 17, wherein said contacting is carried out at temperature in a range of from about 20° C. to about 40° C.

21. The method of claim 17, wherein the fluoride source comprises a fluoride-containing compound selected from the group consisting of ammonium fluoride, hydrogen fluoride, ammonium bifluoride, tetraalkylammonium difluoride, alkyl phosphonium difluoride, and triethylamine trihydrofluoride.

22. The method of claim 17, wherein the at least one organic amine comprises N-(2-cyanoethyl)ethylenediamine.

23. The method of claim 17, wherein the aqueous-based removal composition further comprises at least one additional organic amine.

24. The method of claim 23, wherein the at least one additional organic amine comprises an amine-containing compound selected from the group consisting of hydroxyethylpiperazine, hydroxypropylpiperazine, amino ethylpip erazine, aminopropylpiperazine, hydroxyethylmorpho line, hydroxypropylmorpho line, amino ethylmorpho line, aminopropylmorpho line, triethanolamine, pentamethyldiethylenetriamine, dimethylaminoethoxyethanol, aminoethoxyethanol, ethylene urea, trimethylaminoethylethanolamine, trimethylaminopropylethanolamine, and N-(2-cyanopropyl) ethylenediamine.

25. The method of claim 17, wherein the at least one organic solvent comprises a compound selected from the group consisting of 1,4-butanediol, 1,3-butanediol, ethylene glycol, propylene glycol, N-methyl-2-pyrrolidone, DMSO, r-butyrolactone, propylene glycol monomethyl ether, propylene glycol monomethyl ether acetate, diethyleneglycol monobenzylether, ethyl lactate, ammonium lactate, and dimethyl acetamide.

26. The method of claim 17, comprising at least one chelating agent selected from the group consisting of iminodiacetic acid, boric acid, ammonium borate, ammonium tetraborate, gluconic acid, mannitol, and sorbitol.

27. The method of claim 17, comprising at least one surfactant selected from the group consisting of: ($C_1$-$C_{15}$) alkyl glucosides; ($C_1$-$C_{15}$) alkyl ethylene oxide/propylene oxide; ($C_1$-$C_{10}$) alkyl phenoxy ethylene oxide/propylene oxide; and oxirane, methyl-, polymer with oxirane, ether with 2,2'-(oxidoimino)bis(ethanol) (2:1) and N(-3-(C(-11-isoalkyloxy) propyl) derivatives.

28. The method of claim 17, selected from the group consisting of Formulations A-F, wherein all percentages are by weight, based on total weight of the formulation:
Formulation A
about 8% $NH_4F$/HF;
about 30% hydroxyethylmorpholine;
about 7% N-(2-cyanoethyl) ethylenediamine;
about 15% propylene glycol monomethyl ether;
about 40% de-ionized water; and
about 0.05% decyl glucoside;
Formulation B
about 8% $NH_4F$/HF;
about 30% hydroxyethylmorpholine;
about 7% N-(2-cyanoethyl) ethylenediamine;
about 25% propylene glycol monomethyl ether; and
about 30% de-ionized water;
Formulation C
about 8% $NH_4F$/HF;
about 30% hydroxyethylmorpholine;
about 7% N-(2-cyanoethyl) ethylenediamine;
about 24% propylene glycol monomethyl ether;
about 30% de-ionized water; and
about 1% ammonium tetraborate;
Formulation D
about 8% $NH_4F$/HF;
about 30% hydroxyethylmorpholine;
about 7% N-(2-cyanoethyl) ethylenediamine;
about 15% propylene glycol monomethyl ether;
about 40% de-ionized water; and
about 0.10% alkyl EOPO amine oxide surfactant;
Formulation E
about 8% $NH_4F$/HF;
about 30% hydroxyethylmorpholine;
about 7% N-(2-cyanoethyl) ethylenediamine;
about 15% propylene glycol monomethyl ether;
about 40% de-ionized water; and
about 0.10% EO octylphenol surfactant; and
Formulation F
about 8% $NH_4F$/HF;
about 30% hydroxyethylmorpholine;
about 7% N-(2-cyanoethyl) ethylenediamine;
about 15% propylene glycol monomethyl ether;
about 40% de-ionized water; and
about 0.10% EO nonylphenol surfactant;
wherein the total of the weight percentages of such components of the composition does not exceed 100% by weight.

29. The method of claim 17, wherein the composition comprises the following components, based on total weight of the composition:
0.1% wt.-15.0% wt. fluoride source;
20.0% wt.-60.0% wt. total organic amine;
1.0% wt.-60.0% wt. total organic solvent;
20.0% wt.-70.0% wt. water;
0.000% wt.-20.0% wt. chelating agent; and
0.000% wt.-5.0% wt. surfactant,
wherein the total of the weight percentages of such components of the composition does not exceed 100% by weight.

30. The method of claim 17, wherein the pH of the composition is in a range from about 5 to about 9.

31. The method of claim 17, further comprising contacting the substrate with deionized water following contact with the aqueous-based removal composition.

32. The method of claim 17, further comprising residue material selected from the group consisting of photoresist, BARC materials, gap fill materials, and combinations thereof.

* * * * *

UNITED STATES PATENT AND TRADEMARK OFFICE
CERTIFICATE OF CORRECTION

PATENT NO. : 7,888,301 B2
APPLICATION NO. : 10/581475
DATED : February 15, 2011
INVENTOR(S) : David D. Bernhard et al.

It is certified that error appears in the above-identified patent and that said Letters Patent is hereby corrected as shown below:

Column 8, lines 52-53: change "amino ethylpip erazine" to --aminoethylpiperazine--;

Column 10, lines 55-56: change "amino ethylpip erazine" to --aminoethylpiperazine--;

Column 10, line 56: change "hydoxyethylmorpho line" to --hydoxyethylmorpholine--;

Column 10, line 57: change "hydoxypropylmorpho line" to --hydoxypropylmorpholine--;

Column 10, line 57: change "amino ethylmorpho line" to --aminoethylmorpholine--;

Column 10, lines 57-58: change "aminopropylmorpho line" to --aminopropylmorpholine--;

Signed and Sealed this
Fifth Day of April, 2011

David J. Kappos
*Director of the United States Patent and Trademark Office*